US010729011B2

(12) United States Patent
Carel et al.

(10) Patent No.: US 10,729,011 B2
(45) Date of Patent: Jul. 28, 2020

(54) METHOD OF PROVIDING POWER INPUT TO A FLEXIBLE PRINTED CIRCUIT AND A FLEXIBLE PRINTED CIRCUIT HAVING POWER INPUT IN ACCORDANCE WITH THE METHOD

(71) Applicant: TF MASSIF TECHNOLOGIES LTD., Burnaby (CA)

(72) Inventors: Alain Carel, Vancouver (CA); Kimball Andersen, Coquitlam (CA)

(73) Assignee: TF Massif Technologies Ltd., Burnaby, BC (CA)

(*) Notice: Subject to any disclaimer, the term of this patent is extended or adjusted under 35 U.S.C. 154(b) by 0 days.

(21) Appl. No.: 16/546,891

(22) Filed: Aug. 21, 2019

(65) Prior Publication Data
US 2020/0077519 A1    Mar. 5, 2020

(30) Foreign Application Priority Data

Aug. 31, 2018   (CA) ...................................... 3016051

(51) Int. Cl.
*H05K 1/18*    (2006.01)
*H05B 45/00*   (2020.01)

(52) U.S. Cl.
CPC ............. *H05K 1/189* (2013.01); *H05B 45/00* (2020.01); *H05K 2201/09972* (2013.01); *H05K 2201/10106* (2013.01); *H05K 2201/10651* (2013.01)

(58) Field of Classification Search
None
See application file for complete search history.

(56) References Cited

U.S. PATENT DOCUMENTS

| | | | | |
|---|---|---|---|---|
| 5,375,044 A | * | 12/1994 | Guritz | A41D 27/085 362/103 |
| 6,411,359 B1 | * | 6/2002 | Kobayashi | G02F 1/13452 349/149 |
| 7,557,776 B2 | * | 7/2009 | Inoue | G09G 3/2965 345/60 |
| 8,244,486 B2 | * | 8/2012 | Zhang | G01M 5/00 324/240 |
| 8,724,038 B2 | * | 5/2014 | Ganapathi | G02B 26/0833 345/173 |
| 9,052,545 B2 | * | 6/2015 | Son | G02F 1/133615 |
| 9,282,893 B2 | * | 3/2016 | Longinotti-Buitoni | A61B 5/6804 |
| 9,316,858 B2 | * | 4/2016 | Yabuta | G02F 1/133509 |
| 2006/0181772 A1 | * | 8/2006 | Byers | B60R 1/088 359/512 |
| 2007/0279570 A1 | * | 12/2007 | Ichikawa | G02F 1/13452 349/150 |

(Continued)

FOREIGN PATENT DOCUMENTS

WO     2017127943 A1    8/2017

*Primary Examiner* — Crystal L Hammond
(74) *Attorney, Agent, or Firm* — Davis & Bujold PLLC; Michael J. Bujold

(57) ABSTRACT

A method of providing power input to a flexible printed circuit. The method involves the step of bisecting a flexible printed circuit into a first conductive area adapted for power input and a second conductive area adapted for ground connection. In accordance with this teaching, power input is provided to electrical components attached to the flexible printed circuit via first conductive area and second conductive area, rather than through individual control lines.

14 Claims, 5 Drawing Sheets

(56) References Cited

U.S. PATENT DOCUMENTS

| | | | |
|---|---|---|---|
| 2008/0048817 A1* | 2/2008 | Mahawili | H02K 3/26 336/206 |
| 2009/0040415 A1* | 2/2009 | Kim | G02F 1/13452 349/56 |
| 2010/0312625 A1* | 12/2010 | Miller | A63F 1/02 705/14.5 |
| 2012/0097987 A1* | 4/2012 | Ryu | H01L 51/524 257/88 |
| 2014/0022390 A1* | 1/2014 | Blank | B60R 1/12 348/148 |
| 2016/0313769 A1* | 10/2016 | Yoshitani | G04G 17/045 |
| 2018/0217465 A1* | 8/2018 | Nagata | G02F 1/13338 |
| 2018/0341290 A1* | 11/2018 | Sim | G06F 1/1643 |
| 2019/0029116 A1 | 1/2019 | Carel | |
| 2019/0043928 A1* | 2/2019 | Hong | H01L 51/5253 |
| 2019/0243492 A1* | 8/2019 | Uken | B60R 1/072 |

\* cited by examiner

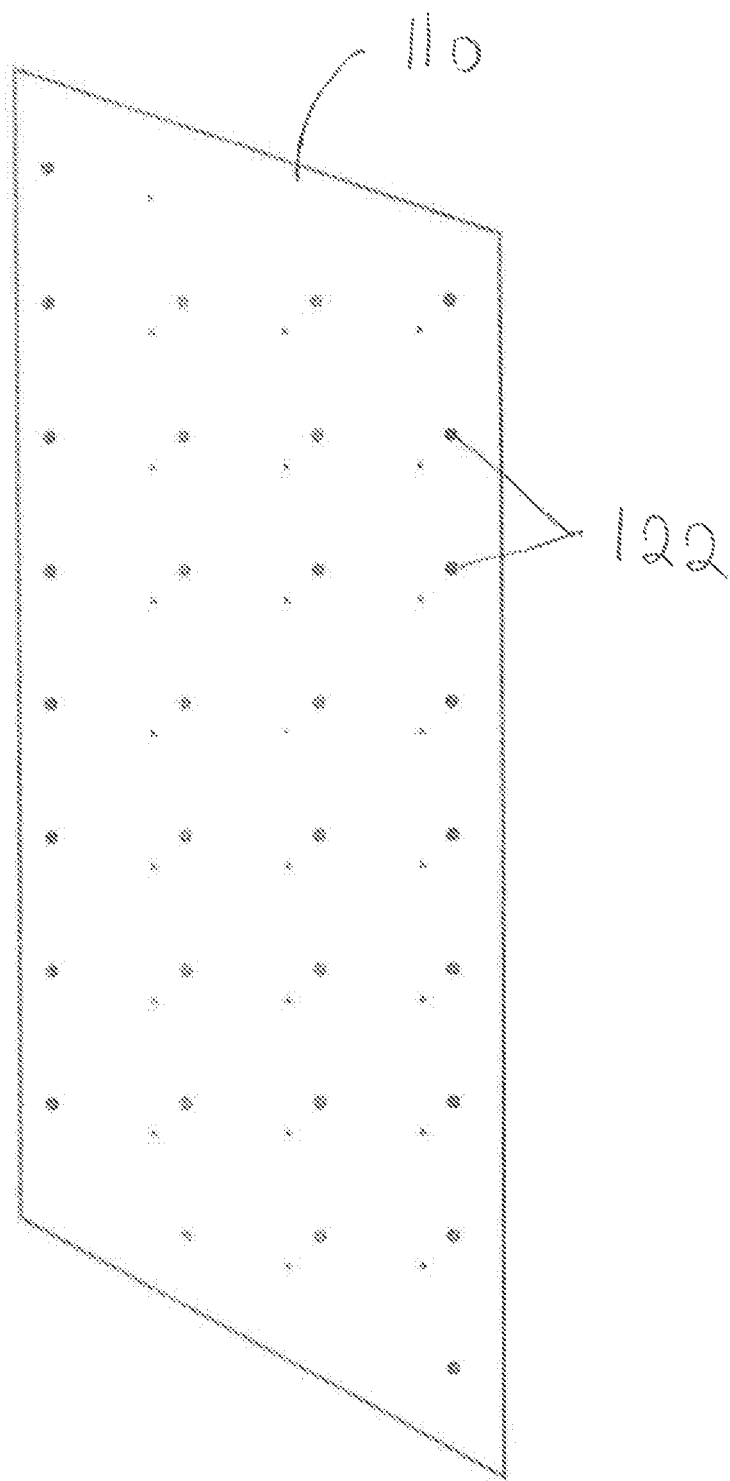

METHOD OF PROVIDING POWER INPUT TO A FLEXIBLE PRINTED CIRCUIT AND A FLEXIBLE PRINTED CIRCUIT HAVING POWER INPUT IN ACCORDANCE WITH THE METHOD

FIELD

There is described a method of providing power input to a flexible printed circuit and a flexible printed circuit having power input in accordance with the method.

BACKGROUND

International Patent Publication WO2017/127943 (Carel) titled "Flexible Printed Circuit" describes that Point of Purchase (POP) stand-up displays are typically constructed by cutting a small hole out through cardboard that has been imprinted with graphics. An LED is then manually pushed through the hole, so the LED protrudes from a front of the cardboard and is secured in place with tape positioned at a back of the cardboard. A conductive wire extends to a power transformer box, which is attached to the back of the cardboard by double sided adhesive tape. A power cord is run from the power transformer box to an external power outlet in a wall. When activated, the LED blinks on and off.

The Carel reference goes on to describe a flexible printed circuit that can be robed or folded. The Carel reference further describes "butterfly" connectors that are used to connect electrical components, such as light emitting diodes (LEDs), to the flexible printed circuit. The connectors are referred to as "butterfly" connectors due to their shape, having a body with a central portion and opposed wing portions.

To integrate large numbers of LEDs into a thin flexible circuit, with the ability to control each LED separately, it is necessary to provide at least one control line per LED with common power (direct control), or two individual control lines (some can be shared in multiplexed scenarios). Routing these large number of traces can be a difficult task, and as density increases, the trace width must decrease to accommodate. This necessitates a thicker conductive material, to ensure adequate power delivery, compromising the flexibility of the circuit and increasing the cost. In addition, it is often necessary to have traces cross and, therefore, multiple layers are needed.

There will hereinafter be provided an alternative approach to providing power to electrical components on a flexible printed circuit.

SUMMARY

According to one aspect there is provided a method of providing power input to a flexible printed circuit. The method involves the step of bisecting a flexible printed circuit into a first conductive area adapted for power input and a second conductive area adapted for ground connection. In accordance with this teaching, power input is provided to electrical components attached to the flexible printed circuit via first conductive area and second conductive area.

It will immediately be apparent that the above described method does not restrict flexibility to the degree that the use of control lines unavoidably does.

There will hereinafter he described the use of this method in a practical application. In the described application the flexible printed circuit is bisected by communication lines between the electrical components. The electrical components are light emitting diodes (LEDs), which are attached to the flexible printed circuit by a conductive adhesive. It is preferred that the LEDs have integrated controllers that use a serial communications protocol that facilitates daisy chaining. It will be understood that LEDs have been chosen as the most obvious immediate application for the method. However, the method has broader application to other electrical components.

According to another aspect, there is provided a flexible printed circuit that has been fabricated in accordance with the method. The flexible printed circuit has a flexible printed circuit substrate bisected by communication lines between electrical components into a first conductive area adapted for power input and a second conductive area adapted for ground connection. Electrical components are attached to the substrate along the communication lines and connected to the first conductive area and the second conductive area. With this connection power input is provided to the electrical components via first conductive area and second conductive area.

BRIEF DESCRIPTION OF THE DRAWINGS

These and other features will become more apparent from the following description in which reference is made to the appended drawings, the drawings are for the purpose of illustration only and are not intended to be in any way limiting, wherein:

FIG. 5 is a rear elevation view of the display of FIG. 2.

DETAILED DESCRIPTION

Figure 1:
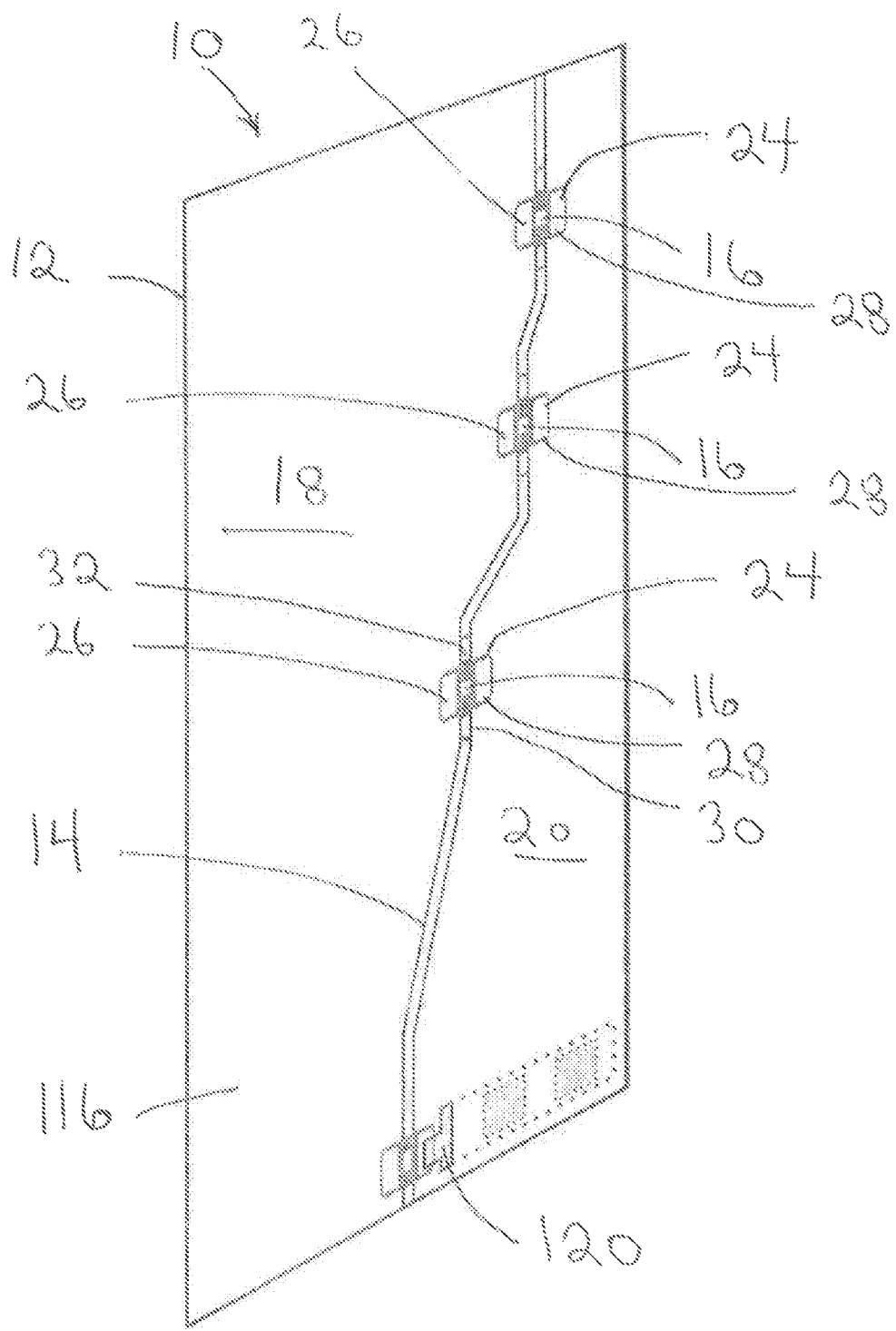
FIG. 1 is a rear elevation view of a flexible conductive circuit developed for use with a display.

A flexible printed circuit generally identified by reference numeral 10, will now be described with reference to FIG. 1. A display 100 will then he described with reference to FIG. 2 through FIG. 5.

Method

Referring to FIG. 1, in broad terms the method of providing power input to flexible printed circuit 10 consists of bisecting flexible printed circuit 10 into first conductive area 18 adapted for power input and a second conductive area 20 adapted for ground connection. Power input is then provided to electrical components, such as LEDs 16, attached to flexible printed circuit 10 via first conductive area 18 and second conductive area 20, rather than through individual control lines.

Structure and Relationship of Parts

Referring to FIG. 1, there will now be described the application of the teachings of the method to a practical application represented by flexible printed circuit 10. Flexible printed circuit 10 has a flexible printed circuit substrate 12 bisected by communication lines 14 between electrical components, in the form of light emitting diodes 16 (LEDs) into a first conductive area 18 adapted tor power input and a second conductive area 20 adapted for ground connection. Light emitting diodes 16 (LEDs) are attached to substrate 12 along communication lines 14. Butterfly connectors 24 are used to mount LEDs 16. Each butterfly connector 24 has a first wing 26 and a second wing 28. A conductive adhesive (not visible in this view) is used to attach each butterfly connector 24 to substrate 12, with first wing 26 connected to first conductive area 18 and second wing 28 connected to second conductive area 28. As will hereinafter be described in relation to method and operation, power input is provided to LEDs 16 via first conductive area 26 and second conductive area 28.

It is preferred that LEDs 16 have integrated controllers that use a serial communications protocol that facilitates daisy chaining. Such a system can be implemented by using serially addressable LEDs such as the ws2812. These red, green blue (RGB) LEDs integrate a serial shift register utilizing either a 1 wire or 2 wire serial communication interface. Thus, large common traces can be used to deliver power (voltage and ground), while thin traces connecting the LEDs in sequence provide the signals needed to control the color and brightness of each LED. Common flood filled power delivery areas can be used as well, reducing the amount of material that needs to be removed for subtractive fabrication methods. This also dramatically simplifies the design of the circuit, as individual traces from the controller to each LED are no longer needed.

Each addressable LED 16 receives power through integrated contacts on it's breakout board which connect to of power delivery regions of first conductive area 26 and second conductive area 28. Input signal data comes from input contact 30 through serial communication line 14, from either the controller output or the output of the previous LED in the linear daisy chain, which signal is output to the next LED through output contact 32, again through serial communication line 14.

Cautionary Warnings

It is recommended that an Electrostatic Discharge (ESD) mitigation component be used to protect electrical components on the flexible printed circuit from damages due to static electrical discharge during handling. ESC mitigation components can be integrated into electrical components, such as the controllers of LEDs 16.

Incorporation of Flexible Circuit 10 into Display 100

Figure 2:
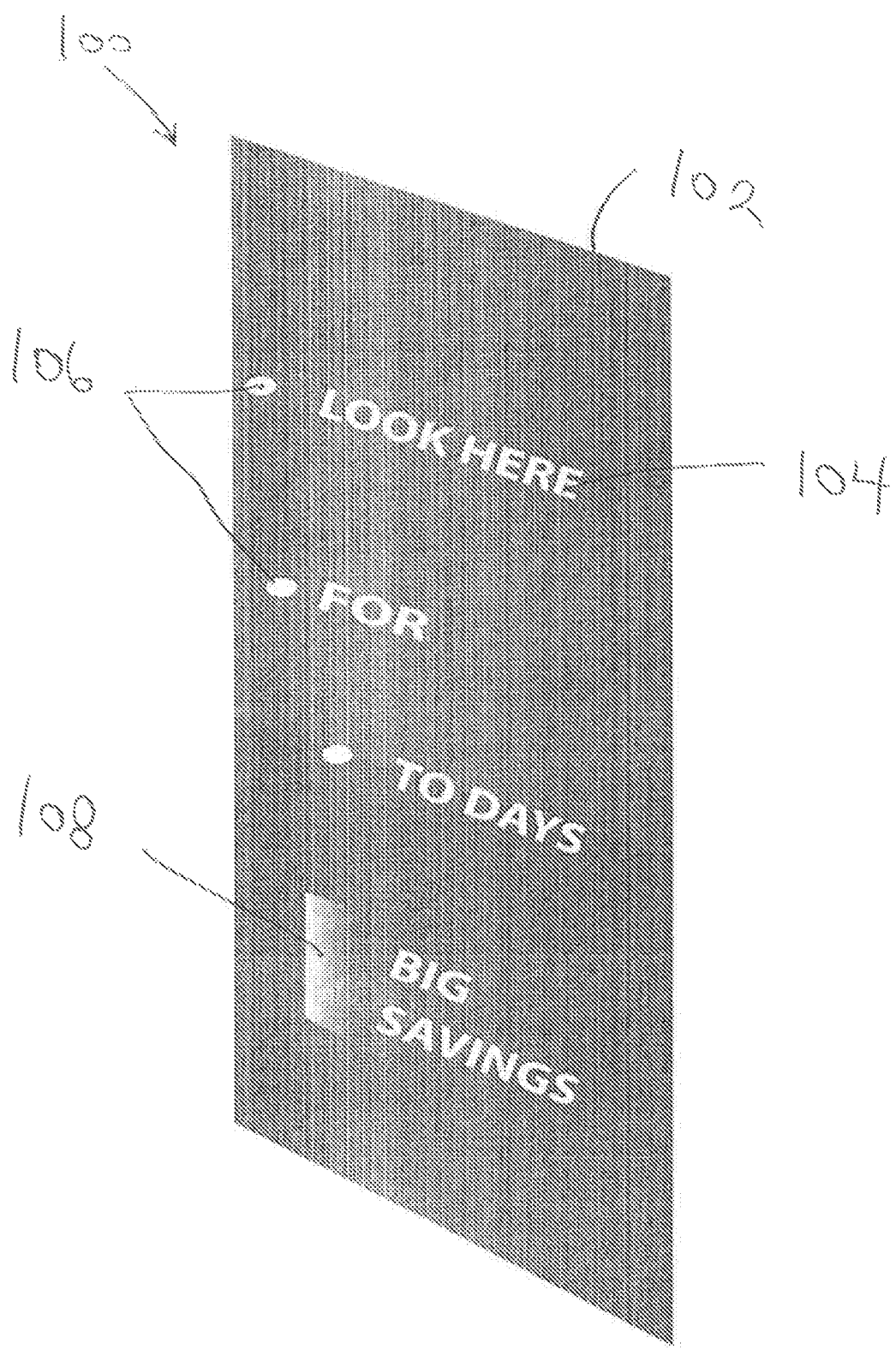
FIG. 2 is a front elevation view of a display into which has been incorporated the flexible conductive circuit of FIG. 1.

Referring to FIG. 2, there is illustrated a front elevation view of display 100 into which flexible conductive circuit has been incorporated. Display 100 includes a graphic overlay 102. Graphic overlay 102 has an alpha-numeric message 104. The messages chosen for illustration is "Look Here For Todays Big Savings" In order to draw attention of the public to graphic overlay 102 and alpha-numeric message 104, display 100 has "windows" for display elements to show through. Two different sizes of "windows" have been selected for illustration: a series of three small windows 106 and a single larger window 108.

Figure 3:
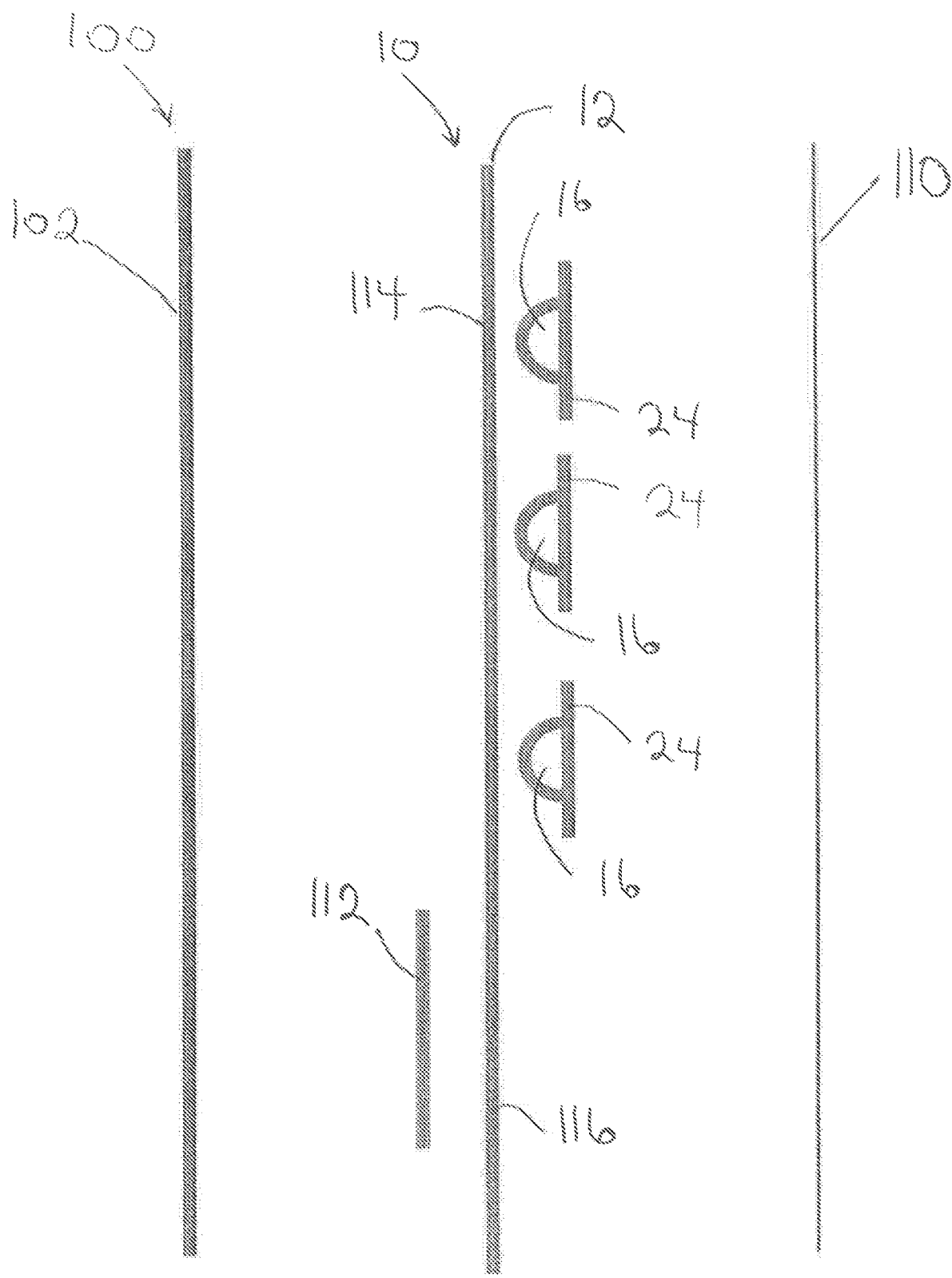
FIG. 3 is an exploded side elevation view of the display of FIG. 2.

Referring to FIG. 3, there is illustrated an exploded side elevation view of the various layers that make up display 100. Those layers include graphic overlay 102, flexible conductive circuit 10 and a conformal protective backing layer 110. Also visible in this view are butterfly connectors 24 supporting LEDs 16. As previously described, butterfly connectors 24 secure LEDs to flexible conductive circuit 10.

As will hereinafter be further described, LEDs 16 are positioned so that they light they project is visible through small windows 106 of graphic overlay 102. Also visible in this view is an ePaper display element 112. As will hereafter further described ePaper display element 112. ePaper display element 112 has been chosen for illustration, to demonstrate that various display elements can be used. The application is not restricted to the use of LEDs. As will hereinafter be further described, ePaper display element 112 is positioned so that the light it projects is visible through larger window 108 of graphic overlay 102. To assist in orientation, flexible printed circuit substrate 12 for flexible conductive circuit 10 is shown in FIG. 3, as having a front face 114 on which is positioned a front circuit and a rear face 116 on which is positioned a rear circuit.

Figure 4:
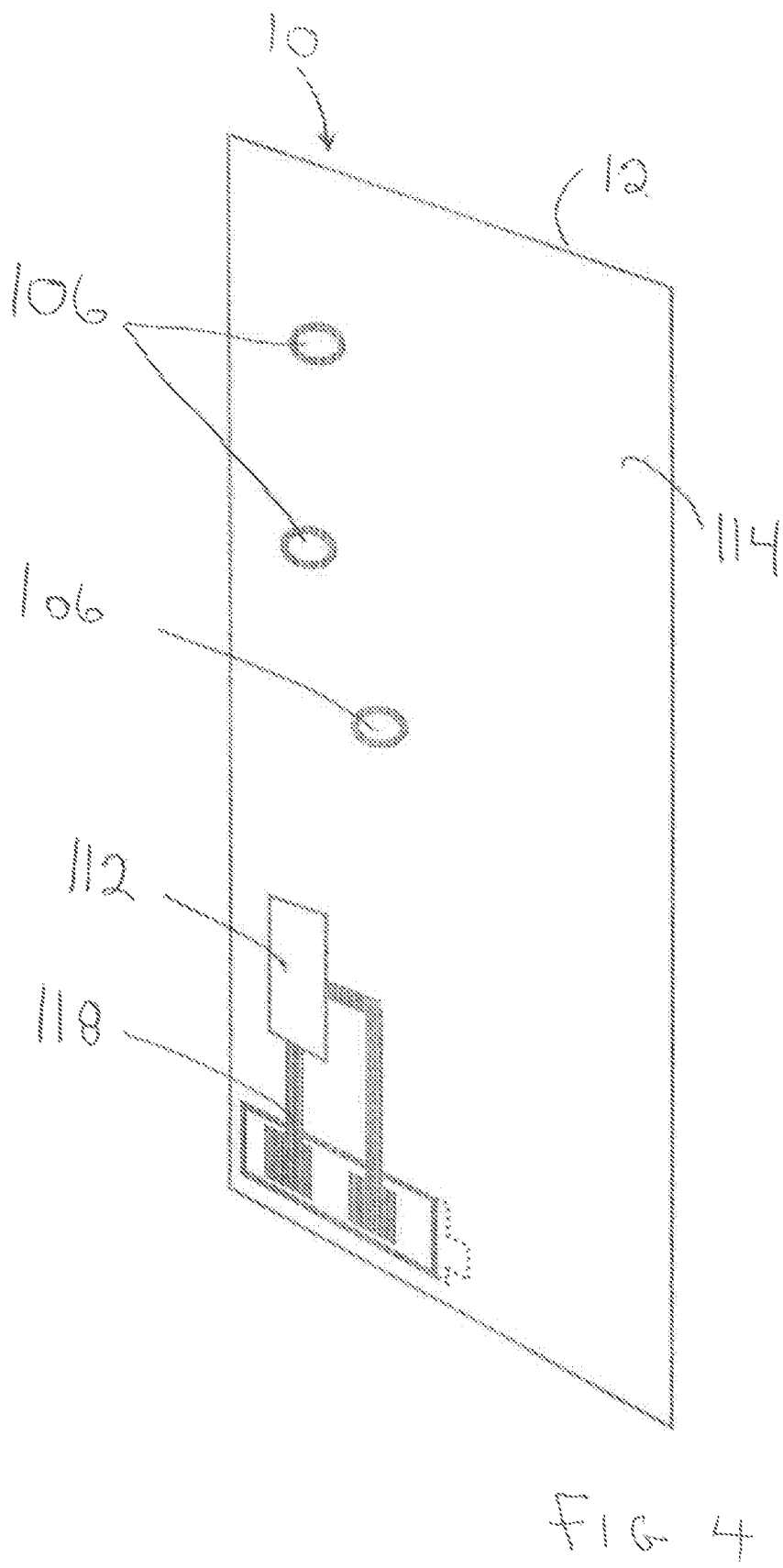
FIG. 4 is a front elevation view of the flexible conductive circuit of FIG. 1.

This example has been selected to demonstrate that a circuit need not be limited to one face of substrate 12. There can be a rear circuit on a rear face 116 and a front circuit on a front face 114. Referring to FIG. 4, there is illustrated a front elevation view showing front face 114 of flexible conductive circuit 10. From this front elevation view, it can be seen that flexible conductive circuit 10 has three small windows 106, which correspond to the three small windows 106 in graphic overlay 102. The small windows 106 have been given the same reference numeral to help the reader understand that they are aligned so that LEDs 16 mounted to rear face of flexible conductive circuit 10 are visible through small windows 106 on graphic overlay 102. Also visible is a connector circuit 118 for ePaper display element 112. Connector circuit 118 is connected to controller 120 on rear face 116 of flexible conductive circuit 10, with a flexible connector that extends through holes in substrate 12 for flexible conductive circuit 10 or wraps around an edge of substrate 12.

Referring to FIG. 5, rear face 116 of flexible conductive circuit is protected by conformal protective backing layer 110. Backing layer 110 is secured by rear face 116 of flexible conductive circuit 10 by adhesive arranged in a pattern of dots 122.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

The scope of the claims should not be limited by the illustrated embodiments set forth as examples, but should be given the broadest interpretation consistent with a purposive construction of the claims in view of the description as a whole.

What is claimed is:

1. A method of providing power input to a flexible printed circuit, comprising:
   bisecting a flexible printed circuit into a first conductive area adapted for power input and a second conductive area adapted for ground connection, such that power input is provided to electrical components attached to the flexible printed circuit via first conductive area and second conductive area.

2. The method of claim 1, wherein the flexible printed circuit is bisected by communication lines between the electrical components.

3. The method of claim 2, wherein the electrical components are light emitting diodes (LEDs).

4. The method of claim 3, wherein the LEDs have integrated controllers that use a serial communications protocol that facilitates daisy chaining.

5. The method of claim 1, wherein the electrical components are attached by conductive adhesive.

6. A flexible printed circuit, comprising:
a flexible printed circuit substrate bisected by communication lines between electrical components into a first conductive area adapted for power input and a second conductive area adapted for ground connection; and
electrical components attached to the substrate along the communication lines and connected to the first conductive area and the second conductive area with power input provided to the electrical components via first conductive area and second conductive area.

7. flexible printed circuit of claim 6, wherein the electrical components are light emitting diodes (LEDs).

8. The flexible printed circuits of claim 7, wherein the LEDs have integrated controllers that use a serial communications protocol that facilitates daisy chaining.

9. A display, comprising:
a substrate with a front face and a rear face, a rear circuit on the rear face of the substrate bisected by communication lines between electrical components into a first conductive area adapted for power input and a second conductive area adapted for ground connection;
light emitting diodes attached to the rear circuit on the rear face of the substrate along the communication lines and connected to the first conductive area and the second conductive area with power input provided to the electrical components via first conductive area and second conductive area;
light transmissible areas in the substrate through which light emitted by the light emitting diodes is visible; and
a graphic overlay covering the front face of the substrate, the graphic overlay having light transmissible areas aligned with the light transmissible areas in the substrate.

10. The display of claim 9, wherein a protective backing layer covers the rear face of the substrate.

11. The display of claim 9, wherein the front face of the substrate has a front circuit printed to which electrical components are attached.

12. The display of claim 11, wherein the front circuit and the rear circuit are able to communicate to each other.

13. The display of claim 12, wherein the communication is through conductive vias in the material.

14. The display of claim 12, wherein the communication is through a flexible connector which passes through an opening in the substrate.

* * * * *